US008853544B2

(12) United States Patent
Kondou et al.

(10) Patent No.: US 8,853,544 B2
(45) Date of Patent: Oct. 7, 2014

(54) METHOD OF TRANSFERRING THIN FILM COMPONENTS AND CIRCUIT BOARD HAVING THE SAME

(75) Inventors: Ryuichi Kondou, Tokyo (JP); Kenichi Ota, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 181 days.

(21) Appl. No.: 13/416,780

(22) Filed: Mar. 9, 2012

(65) Prior Publication Data

US 2012/0228008 A1 Sep. 13, 2012

(51) Int. Cl.
*H05K 1/00* (2006.01)

(52) U.S. Cl.
USPC ............ 174/250; 174/260; 361/58; 257/57; 257/431; 257/678; 257/700; 438/118; 438/141; 438/438; 438/459

(58) Field of Classification Search
USPC ............ 174/250, 260; 361/58; 257/57, 431, 257/678, 700; 438/118, 141, 438, 459
See application file for complete search history.

(56) References Cited

U.S. PATENT DOCUMENTS

| 5,043,248 | A | * | 8/1991 | Uekita et al. ............... 430/270.1 |
| 7,482,274 | B2 | * | 1/2009 | Ono et al. ...................... 438/689 |
| 8,298,875 | B1 | * | 10/2012 | Or-Bach et al. ............... 438/141 |
| 8,373,230 | B1 | * | 2/2013 | Or-Bach et al. ............... 257/347 |
| 8,541,819 | B1 | * | 9/2013 | Or-Bach et al. ............... 257/211 |
| 2003/0179191 | A1 | * | 9/2003 | Matsuda et al. ............. 345/204 |
| 2003/0222334 | A1 | * | 12/2003 | Ikeda et al. ................... 257/678 |
| 2004/0070903 | A1 | * | 4/2004 | Nagai et al. ..................... 361/58 |
| 2004/0147092 | A1 | * | 7/2004 | Liao et al. ..................... 438/438 |
| 2005/0051870 | A1 | * | 3/2005 | Yamazaki et al. ............ 257/531 |
| 2007/0275506 | A1 | * | 11/2007 | Yamazaki et al. ............ 438/118 |
| 2009/0230542 | A1 | * | 9/2009 | Lin et al. ....................... 257/700 |
| 2010/0025095 | A1 | * | 2/2010 | Guo et al. ...................... 174/260 |
| 2010/0072474 | A1 | * | 3/2010 | Abe et al. ......................... 257/57 |
| 2011/0097874 | A1 | * | 4/2011 | Broekaart et al. ............ 438/459 |
| 2012/0007159 | A1 | * | 1/2012 | Yamazaki et al. ............ 257/296 |
| 2012/0056288 | A1 | * | 3/2012 | Yoshihara et al. ............ 257/431 |

FOREIGN PATENT DOCUMENTS

| JP | 9-148538 | A | 6/1997 |
| JP | 2002-305334 | A | 10/2002 |
| JP | 2004-111400 | A | 4/2004 |
| JP | 2008-004572 | A | 1/2008 |
| JP | 2008-166757 | | 7/2008 |
| JP | 2008-166757 | A | 7/2008 |
| JP | 2010-251403 | | 11/2010 |

OTHER PUBLICATIONS

Taiwanese Office Action dated Jun. 20, 2014 for Appln. No. 101108210.

* cited by examiner

*Primary Examiner* — Xiaoliang Chen
(74) *Attorney, Agent, or Firm* — Pillsbury Winthrop Shaw Pittman LLP

(57) ABSTRACT

Various aspects of the present invention provide a transfer method for peeling off an MIM structure (comprising lower electrode/dielectric layer/upper electrodes) film formed on a supporting substrate and then transferring onto a transfer substrate with sufficiently uniform and low damage. Various aspects of the present invention also provide a thin film element provided with one or more thin film components which are transferred onto a substrate by using said method.

20 Claims, 5 Drawing Sheets

(A)

(B)

METHOD OF TRANSFERRING THIN FILM COMPONENTS AND CIRCUIT BOARD HAVING THE SAME

BACKGROUND

The present invention relates to a thin film component transfer method for transferring thin film components, such as thin film capacitors, formed on a supporting substrate transfer substrate. The present invention also relates to a circuit board provided with one or more transferred thin film components.

It is desired to provide combined modules incorporating ICs, capacitors, and inductors and passive modules with a low profile to be mounted on mobile communication devices such as cellular phones. For that purpose, for example, techniques for forming thin film capacitors with a high capacity on a printed board or resin substrate are desired. In order to form thin film capacitors on a non-heat resistant substrate such as Si interposer including polyimide or TSV, thin film capacitors must be formed at a temperature higher than the upper temperature limit of such a non-heat resistant substrate. Accordingly, thin film capacitors with a high dielectric constant are required to be formed at low temperature.

Japanese Patent Application Publication No. 2004-111400 teaches a multilayered printed circuit board using an thin film dielectric and manufacturing method thereof wherein a multilayered printed circuit board using it, and its manufacturing method wherein dielectric constant is 25 or more and a film thickness is 1.5 μm or less and an inorganic filler is dispersed in an organic resin. In addition, Japanese Patent Application Publication No. H9-148538 teaches a $(Ba,Sr)TiO_3$ thin film capacitor and manufacturing method thereof wherein an organic metal compound solution composed of the main composition of $(Ba,Sr)TiO_3$ and Si component of 0.1-10 mol % to the main component, 0.1-10 mol % is spread on a substrate to obtain thin film capacitor having a high sinterability at low temperature around 400° C. However, there are limitations in the above conventional methods associated with film formation temperature, which prevent obtaining thin film capacitors with a high capacity.

Another approach to obtain thin film capacitors with high capacity is to form a dielectric film by carrying out a heat treatment at a film formation temperature of 600° C. or more using a heat resistant substrate such as Si substrate. Such a high film formation temperature method may not use a non-heat resistant substrate such as polyimide substrate, epoxy substrate or TSV (Si through-hole electrode) substrate because such a non-heat resistant substrate is vulnerable to heat treatment at high temperature. Yet another approach is to transfer high dielectric thin film capacitors formed on a heat resistant substrate such as Si substrate to a different type of substrate at low temperature. For example, it is know to mechanically peel off a thin film capacitor formed on Si substrate and then transfer the peeled-off capacitor to a different type of substrate via a intervening layer (bonding layer) made of resin.

For example, Japanese Patent Application Publication No. 2008-4572 teaches a low cost dielectric structure and manufacturing method thereof. The dielectric structure, has a high dielectric constant and is formed on a necessary area without waste. The dielectric structure is formed by, prior to transfer, introducing a laminated $SiO_2/Pt$ structure (e.g., a structure comprising Ti or $TiO_2$ for adhesiveness) having a high peeling characteristic into a base electrode on a heat resistant substrate which forms a dielectric film. Further, Japanese Patent Application Publication No. 2002-305334 teaches a functional thin film having a small amount of defects by easily and completely carrying out peeling on the interface between functional thin-film structure and a separation layer comprising metallic nitride by a substrate using the separation layer. Furthermore, Japanese Patent Application Publication No. 2008-166757 teaches an improvement of a transferring process using a laser lift-off process thereby providing an embedded printed board for thin film capacitors that can minimize damages to a dielectric film of the thin film capacitors.

SUMMARY

However, there are various limitations to the above conventional methods.

Various aspects of the present invention provide a transfer method for peeling off an MIM structure (comprising lower electrode/dielectric layer/upper electrodes) film formed on a supporting substrate and then transferring onto a transfer substrate with sufficiently uniform and low damage. Various aspects of the present invention also provide a thin film element provided with one or more thin film components which are transferred onto a substrate by using said method.

One aspect of the present invention relates to a transfer method for transferring a thin film component having a MIM structure from a supporting substrate to a transfer substrate comprising: forming an insulating film on a surface of an MIM film formed on a supporting substrate; forming an adhesive layer made of a metal and Si in a super vacuum atmosphere on the order of, for example, $10^{-6}$-$10^{-7}$ Pa on at least either a first surface of the insulating film or a second surface of the transfer substrate; bonding the supporting substrate and the transfer substrate while applying a load such that the first surface of the supporting substrate and the second surface of the transfer substrate are in contact with one another via the adhesive layer; and transferring the MIM film from the supporting substrate to the transfer substrate; wherein an adhesion force $F_A$ and an adhesion force $F_B$ are controlled to meet the relationship of $F_A > F_B$, where the adhesion force $F_A$ represents an adhesion force of the adhesive layer; and the adhesion force $F_B$ represents an adhesion force at the interface between the supporting substrate and the MIM film.

Various aspects of the present invention also relate to a circuit board comprising a thin film component which is transferred to a transfer substrate via an adhesive layer by any one of the above methods. In addition to the illustrative aspects, embodiments, and features described above, further aspects, embodiments, and features will become apparent by reference to the drawings and the following detailed description.

According to various aspects of the present invention, an adhesive layer made of a metal and Si may be formed on at least either the surface of the MIM film formed on the supporting substrate or another surface of the transfer substrate in a super vacuum atmosphere, and supporting substrate and the transfer substrate are bonded while applying a load such that the surface of the MIM film formed on the supporting substrate and the surface of the transfer substrate are into contact via the adhesive layer wherein the MIM film may be peeled off from the supporting substrate and then transferred onto the transfer substrate. To this end, the adhesion force $F_A$ between the MIM film and the transfer substrate and/or the adhesion force $F_B$ between the MIM film and the supporting substrate may be controlled so as to meet the relationship of $F_A > F_B$ so that the thin film component having an MIM structure can be peeled off from the base substrate and then transferred to the transfer substrate with sufficiently uniform and low damage. Thus, a circuit board having a low profile may be obtained which comprises a thin film component transferred to the transfer substrate by using said transfer method.

DETAILED DESCRIPTION OF THE PREFERRED EMBODIMENTS

Figure 1:
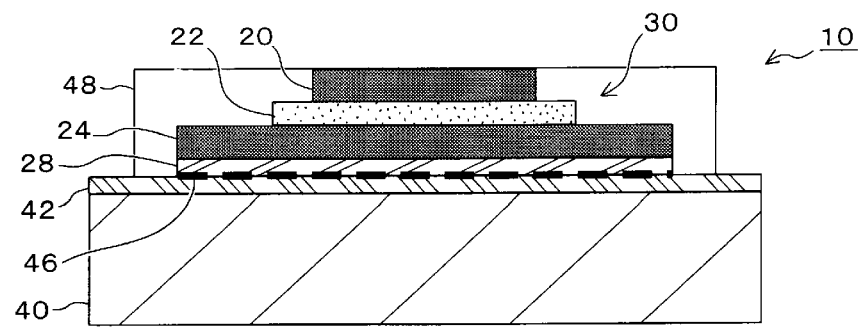
FIG. 1(A) shows a cross section of a laminated structure of a circuit board in accordance with one embodiment of the present invention.
FIG. 1(B) shows a cross section illustrating a peeling interface existing between a thin film component and a supporting substrate and an adhering interface existing between the thin film component a transfer substrate.
Figure 1:
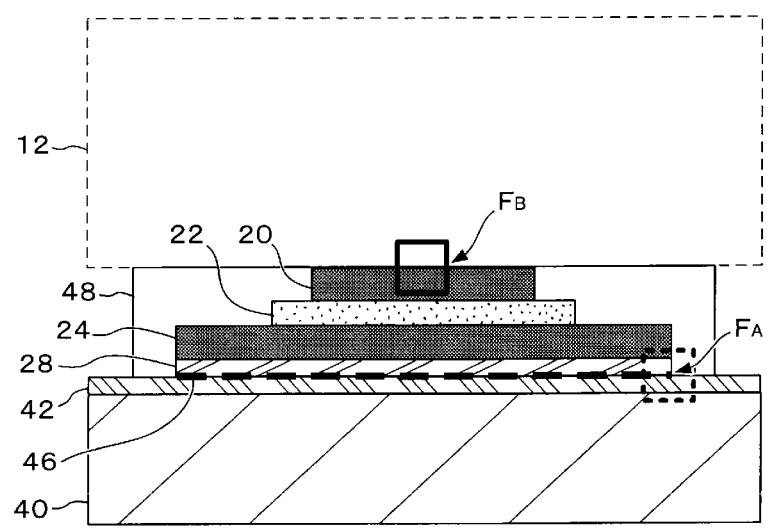

Various embodiments will be described with reference to accompanying drawings. In the description that follows, like components have been given the same or similar reference numerals, regardless of whether they are shown in different embodiments. To illustrate embodiments of the present disclosure in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

As shown in FIG. 1(A), circuit board 10 in accordance with this embodiment comprises a transfer substrate 40 and a thin film capacitor 30 with Si film 42 and adhesive layer 46 therebetween. The Si film 42 may be formed on the substrate 40 in case the material of the transfer substrate 40 or an MIM film 26 to be transferred requires such a film layer. The transfer substrate 40 may be a resin substrate formed of a resin such as polyimide or a non-heat resistant substrate such as TSV. The adhesive layer 46 may be formed of, for example, Si and one or more metals such as Si—Fe, Si—Au, and/or Si—Al. Various materials may be used for the adhesive layer 46 depending on the features of the substrate. The thin film capacitor 30 has an MIM structure which comprises a dielectric layer 22 with a high dielectric constant sandwiched by electrode layers 20, 24, the material of the electrode layers 20, 24 may include, for example, Pt or a conductive film made of RuO or IrO. The material of the dielectric layer 22 may include, for example, BaSrTiO₃, BaTiO₃, or SrTiO₃. As shown, the surface of the thin film capacitor 30 may be covered by covered by an insulating protective film 48. The material of the protective film 48 may include, for example, $SiO_2$, SiN, or $Al_2O_3$. The thin film capacitor 30 may be formed on a heat-resistant supporting substrate by a high-temperature process and then transferred onto the transfer substrate 40.

Now, with reference to FIGS. 2(A)-(G), a transferring process in accordance with one aspect of the present disclosure will be described. First, as shown in FIG. 2(A), an Si base substrate is prepared as the supporting substrate 12, on which an $SiO_2$ film 14 is formed by, for example, a thermal oxidation. While the thickness of the $SiO_2$ film 14 may be, for example, 200 nm or more so as to be insulated from the supporting substrate 12, the surface roughness of the $SiO_2$ film 14 is desired to be as small as possible given the surface roughness may affect the adhesiveness of an MIM film 26 which is formed in a later step. Next, a TiOX layer 15, an electrode layer 16, an interlaminar insulating layer 18, an electrode layer 20, a dielectric layer 22, an electrode layer 24 are formed above the $SiO_2$ film 14 in this order by sputtering. The MIM film 26 includes the electrode layer 20, the dielectric layer 22, and the electrode layer 24. In this embodiment, the electrode layers 16, 20, 22 may be made of, for example, P, the interlaminar insulating layer 18 may be made of, for example, BST, and the dielectric layer 22 may be made of, for example, Mn-BST. In addition, an SiN film as an insulating layer 28 is formed on the MIM film 26 by CVD or any other suitable process.

Subsequently, by applying a hydrogen plasma process to the fore surface of the insulating layer 28 or by applying a hydrogen implantation (hydrogen injection) process to the rear surface of the supporting substrate 12, the adhesiveness of the Pt/BST interface represented by the arrow in FIG. 2(C), i.e., the interface between the interlaminar insulating layer 18 and the electrode layer 20 is reduced. The reduction in the adhesiveness occurs because the interlaminar insulating layer 18 is made of the BST which is vulnerable to hydrogen. Any other suitable process may be used to reduce the adhesiveness of the interfaces of the supporting substrate 12 and the MIM film 26. Next, a tape peeling-off test was carried out to the laminated structure shown in FIG. 2(C), and then a composition analysis by XPS was carried out on the surface of the supporting substrate 12 of the resulting structure. The composition analysis shows that the surface of the supporting substrate 12 is formed of a BST film (interlaminar insulating film 18) surface.

As shown in FIG. 2(D), separately from the portion including the supporting substrate 12, a transfer substrate (e.g., Si substrate, glass substrate, or sapphire substrate) 40 is prepared on which an Si film 42 is formed by, for example, sputtering and then adhesive layers 46A and 46B are formed on the surface of the Si film 42 and the surface of the insulating layer 28 of the supporting substrate 12, respectively. Those adhesive layers 46A and 46B may be made from nano-adhesive layer(s) formed by irradiating Si—Fe ion beam in a super vacuum atmosphere on the order of, for example, $10^{-6}$-$10^{-7}$ Pa. The adhesive layers 46A and 46B may be provided so as to maintain high adhesiveness between the MIM film 26 and the transfer substrate 40. The adhesion force $F_A$ between the insulating layer 28 of the MIM film 26 and the Si film 42 of the transfer substrate 40 (as shown in FIG. 1 (B)) may be controlled through selection of irradiation conditions. For example, by changing the irradiation conditions such that the adhesion force $F_A$ and the adhesion force $F_B$, which is the adhesion force at the interface between the interlaminar insulating film 18 of the supporting substrate 12 and the electrode layer 20 (or the MIM film 26) (as shown in FIG. 1(B)), meet the following relationship: $F_A > F_B$, the MIM film 26 is peeled off from the supporting substrate 12 and then transferred to the portion of the transfer substrate 40.

Figure 2:
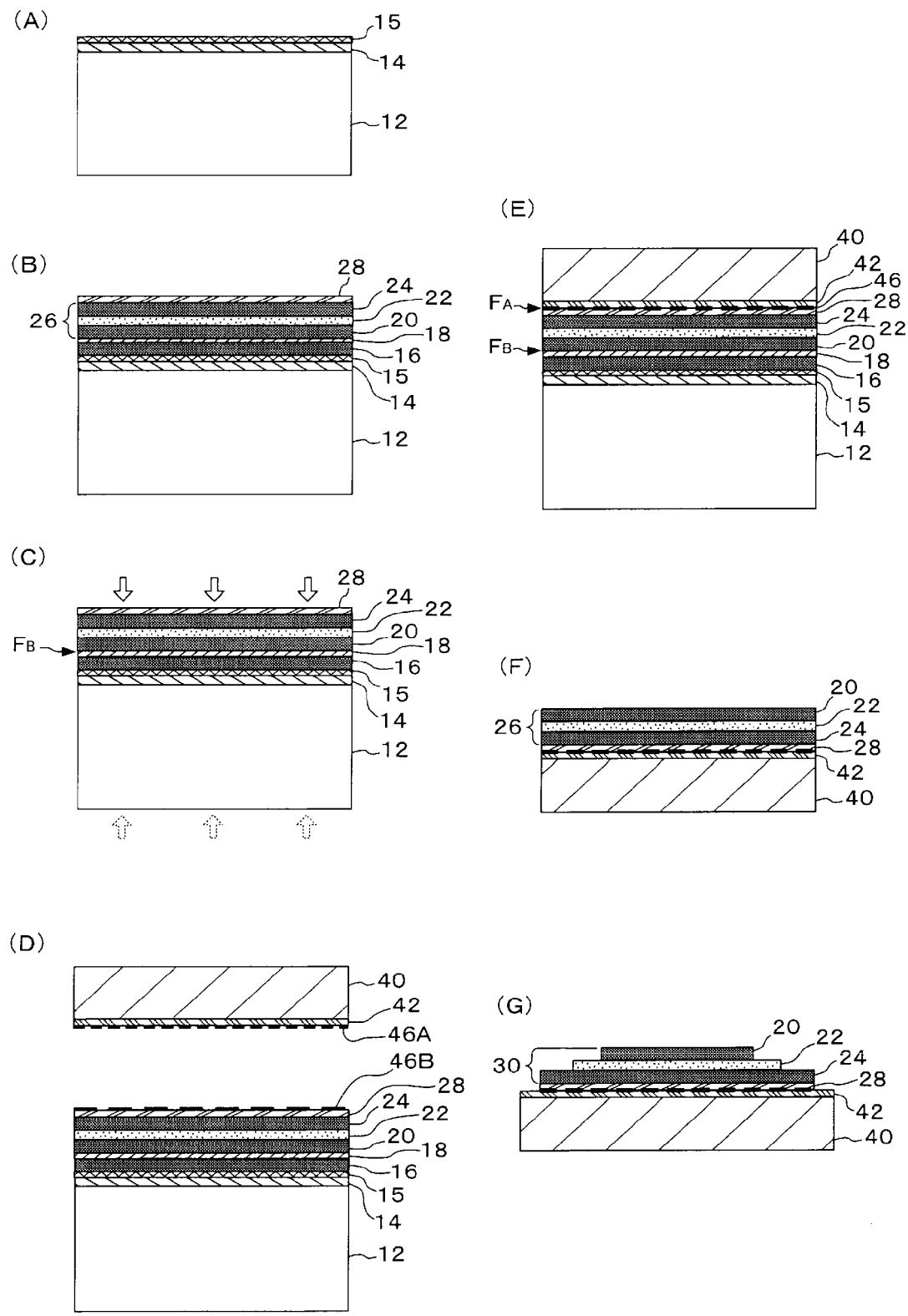
FIG. 2 shows procedural cross-section views illustrating a transferring process in accordance with one aspect of the present invention.

Next, as shown in FIG. 2(E), the supporting substrate 12 and the transfer substrate 40 are stuck with one another such that the adhesive layer 46B of the supporting substrate 12 and the adhesive layer 46A of the transfer substrate 40 may come into contact with one another, and then those substrates are bonded in a vacuum atmosphere while applying a load thereto. The degree of vacuum may be changed according to the material of the substrates. The substrates 12 and 40 may be bonded in the atmosphere. As described above, since the interlaminar adhesion force is controlled so as to meet the relationship $F_A>F_B$, when the transfer substrate 40 is moved away from the supporting substrate 12, the MIM film 26 may be peeled off from the supporting substrate 12 and then transferred onto the transfer substrate 40 as shown in FIG. 2(F). It should be noted that, in FIG. 2(F), the substrate 40 is illustrated as being vertically inverted as compared to those illustrated in FIG. 2(E). It is considered that the resulting transfer substrate 40 and the MIM film 26 are bonded with one another via the Si compound/Si layer (i.e., the intermediate layers including Si film 42 and the adhesive layer 46). If necessary, portions of the interlaminar insulating layer 18 which remain on the electrode layer 20 of the peeled MIM film 26 may be removed by any suitable method. Subsequently, the electrode layer 20 of the MIM film 26 (upper electrode), the dielectric layer 22, and the electrode layer 24 (lower electrode) are processed by, for example, dry etching process such as RIE to form an MIM capacitor 30 as shown in FIG. 2 (G). The MIM capacitor 30 is provided above the transfer substrate 40 via the Si film 42 and the adhesive layer 46. Then, appropriate wiring (not shown) may be provided on the upper portion of the MIM capacitor 30 so as to connect the capacitor 30 with a circuit, and a protective film 48 may be provided. Thus, the circuit board 10 of this embodiment may be obtained.

As described, in this embodiment, the adhesive layers 46A and 46B made of an appropriate metal and Si are formed in a super vacuum atmosphere on each of the surface of the insulating layer 28 provided on the MIM film 26 of the supporting substrate 12 and the surface of the Si film 42 provided on the transfer substrate 40, and the supporting substrate 12 and the transfer substrate 40 are bonded with one another while applying a load thereto such that the respective adhesive layers 46A and 46B may come into contact with one another, and then the MIM film 26 is peeled off and transferred from the supporting substrate 12 to the transfer substrate 40. During those processes, through the control of the adhesion force $F_A$ between the MIM film 26 and the transfer substrate 40 side as well as the process for reducing the adhesion force $F_B$ between the MIM film 26 and the supporting substrate 12 side, the relationship $F_A>F_B$ is met. Accordingly, the following exemplary advantageous effects can be obtained:
(1) The thin film component (thin film capacitor 30) having the MIM structure may be transferred to the transfer substrate 40 with sufficiently uniform and low damage to the thin film component.
(2) The thin film capacitor 30 having high capacity may be transferred onto the transfer substrate 40 (non-heat resistant substrate) without having to carrying out any high-temperature process, which cause a circuit including the thin film capacitor 30 to have a smaller size and lower profile.
(3) The MIM film 26 may be transferred onto the transfer substrate 40 (non-heat resistant substrate) without compromising the components which existed on the supporting substrate 12 before the transfer process.
(4) The supporting substrate 12 may be reusable after peeling the MIM film 26, which can lead to more efficient resource utilization and cost reduction.

Figure 3:
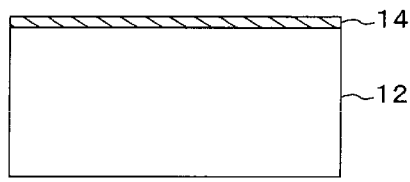
FIG. 3 shows procedural cross-section views illustrating a transferring process in accordance with another aspect of the present invention.
Figure 3:
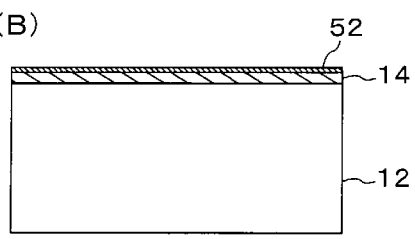
Figure 3:
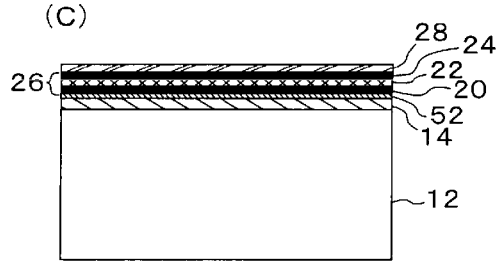
Figure 3:
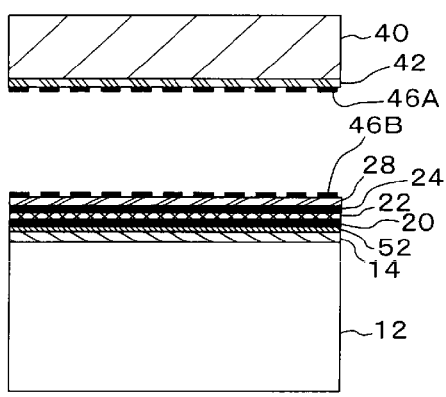
Figure 3:
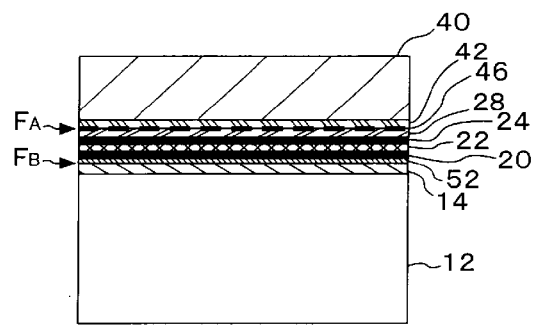
Figure 3:
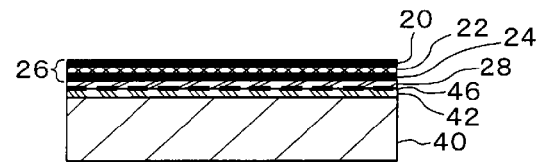
Figure 3:
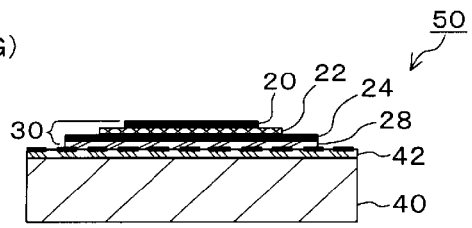
Figure 4:
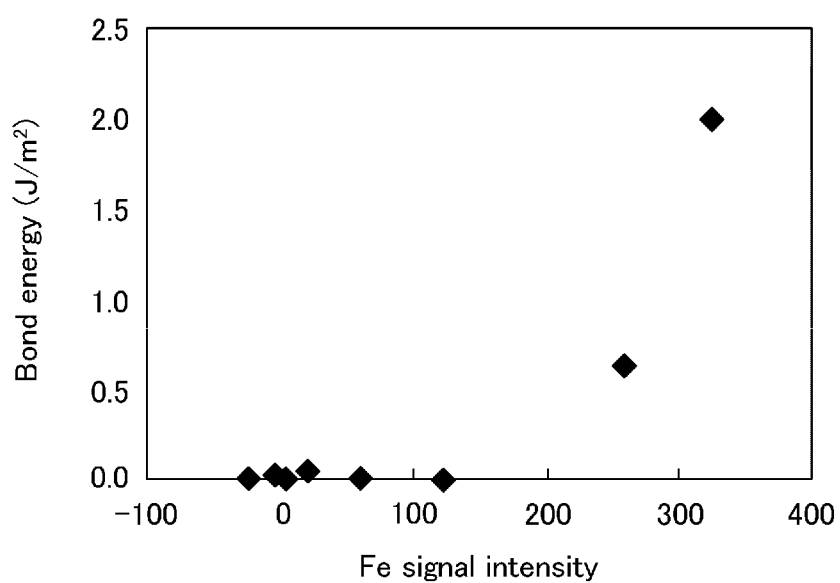
FIG. 4 shows a graph illustrating an example relationship between the surface composition and adhesion strength of Fe in an Si surface manufactured in accordance with the embodiment shown in FIG. 3.

Next, with reference to FIGS. 3 and 4, another embodiment of the transferring process for the thin film component in accordance with the present invention will be described. As shown in FIG. 3(F), the circuit board 50 has the same structure as the circuit board 10 shown in FIG. 1 except for its transferring process. That is, while the above embodiment may peel off and transfer the MIM film 26 with sufficiently uniform and low damage, by controlling both of the adhesion force $F_A$ between the MIM film 26 and the transfer substrate 40 side and the adhesion force $F_B$ between the MIM film 26 and the base substrate 12 side, this embodiment mainly controls the adhesion force $F_A$ in peeling off and transferring the MIM film 26.

As shown in FIG. 3(A), as with the above embodiment shown in FIGS. 1 and 2, at first, a base Si substrate is prepared as the supporting substrate 12, on which an $SiO_2$ film 14 is formed by, for example, a thermal oxidation. Next, as shown in FIG. 3 (B), an SiOF layer (interlaminar insulating layer 52) with a dielectric constant lower than that of an $SiO_2$ film is formed on the surface of the insulating layer 14 by applying a fluorine plasma treatment to the surface of the insulating layer 14. The fluorine plasma treatment may be performed under plasma process conditions where chemically active radical species. The fluorine plasma treatment according to this embodiment may not only control the adhesion force $F_A$ but also facilitate the peeling off of the MIM film 26 from the supporting substrate 12. Next, as shown in FIG. 3(C), an electrode layer 20, a dielectric layer 22, and an electrode layer 24 may be formed on or above the interlaminar insulating layer 52 by sputtering or any other suitable method. Further, an SiN film is formed on the electrode layer 24 as an insulating layer 28 by CVD or any other suitable method.

Then, Si—Fe adhesive layers 46A and 46B are formed on the surface of the transfer substrate 40 having the Si film 42 and the upper surface of the insulating layer 28 of the supporting substrate 12 by irradiating an ion beam (FIG. 3(D)) so that the adhesiveness between the surfaces of the both substrates are sufficiently high. Subsequently, as shown in FIG. 3(E), the supporting substrate 12 and the transfer substrate 40 are bonded with one another while applying a load such that the adhesive layers 46A and 46B come into contact with one another, wherein the adhesion force $F_A$ between the insulating layer 28 associated with the MIM film 26 and the Si film 42 associated with the transfer substrate 40 may be controlled to be greater than the adhesion force $F_B$ between the MIM film 26 and the interlaminar insulating layer 52 in order to enable the MIM film 26 to be transferred onto the transfer substrate 40 in the process shown in FIG. 3(F), which will be further described later. The control of the adhesion force $F_A$ may be carried out through the process illustrated in FIG. 3(D).

The adhesion force (or bonding force) of the Si—SiN substrate (Si substrate and SiN film (insulating layer 28) formed on the Si substrate) may be controlled by adjusting the composition or bonding state of the adhesive layer 46A formed on the supporting substrate 12 side. In this embodiment, the adhesive layer 46B is formed on the transfer substrate 40 side. FIG. 4 shows the relationship between the surface composition and adhesion strength of Fe in an Si surface (at about 5 mm depth from the surface) obtained through XPS wherein the horizontal axis represent the observed signal intensity of Fe and the vertical axis represents binding energy ($J/m^2$). As shown, the more the abundance of Fe exist at the surface, the higher the adhesion strength becomes. Thus, the adhesiveness between Si and SiN can be enhanced. That is, the adhesion force $F_A$ may be controlled by adjusting the abundance of Fe.

When the supporting substrate 12 is moved away from the transfer substrate 40 after the bonding, since the relationship $F_A>F_B$ is met, the MIM film 26 is peeled off from the supporting substrate 12 and then transferred to the transfer substrate 40 FIG. 3(F) shows the resulting substrate as being vertically inverted. Next, as shown in FIG. 3(G), an electrode layer 20, an dielectric layer 22, an electrode layer 24 are processed by, for example, dry etching process such as RIE to form an MIM capacitor 30 above the transfer substrate 40. Then, appropriate wiring (not shown) may be provided on the upper portion of the component so as to connect the component with a circuit. Thus, the circuit board 50 according to this embodiment may be obtained. In accordance with this embodiment, in addition to the advantageous effect noted above, the mirror image engagement force between the supporting substrate 12 side and the electrode material electrode layer 20) may be enhanced since the surface of the supporting substrate 12 is processed by a fluorine plasma treatment to form a low dielectric constant layer (interlaminar insulating layer 52).

Figure 5:
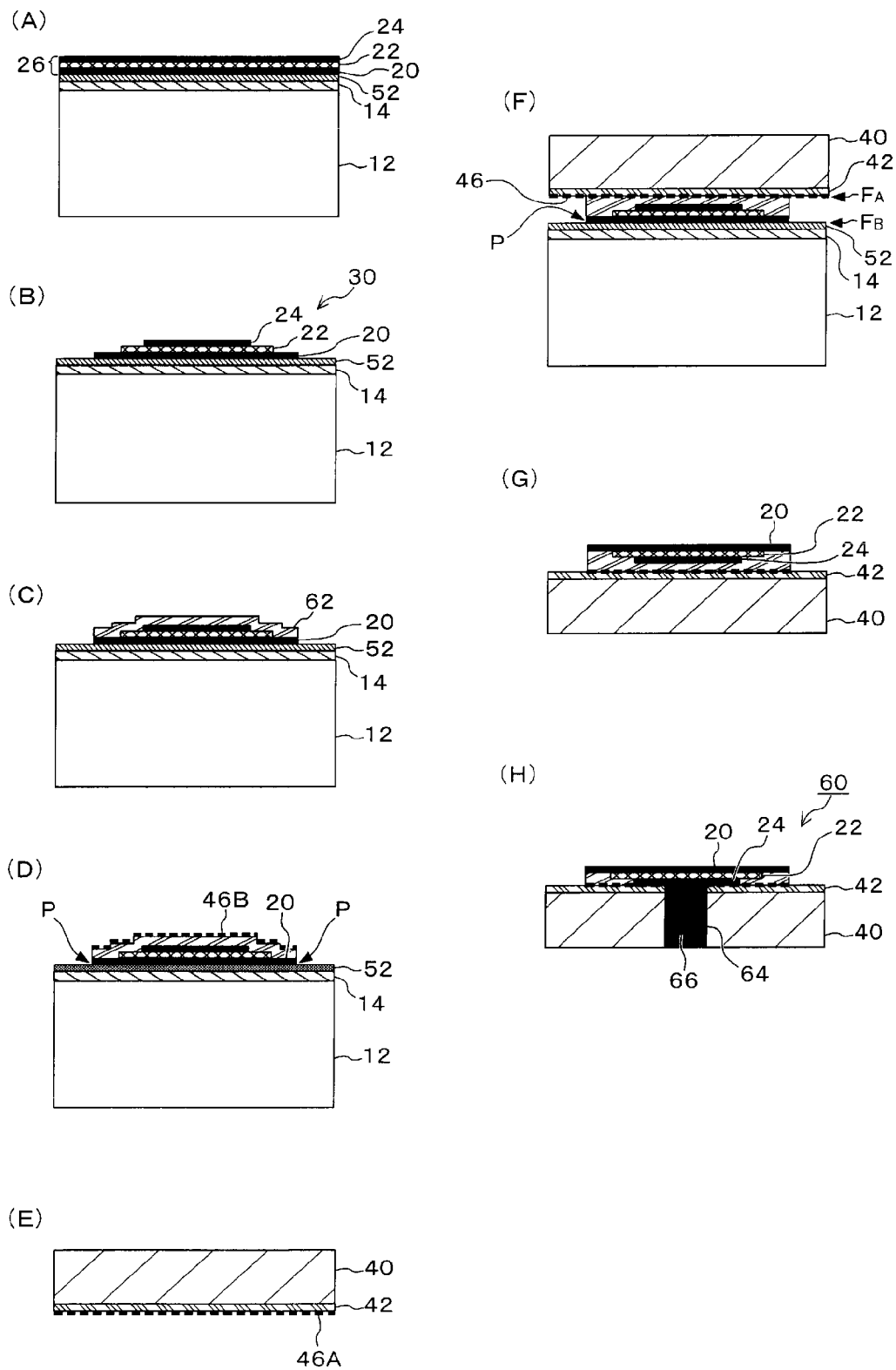
FIG. 5 shows procedural cross-section views illustrating a transferring process in accordance with yet another aspect of the present invention.

Next, with reference to FIG. 5, a transferring process of a thin film component in accordance with yet another embodiment of the present invention will be described. In this embodiment, an MIM capacitor 30 is formed before transferring the MIM film 26 onto the transfer substrate 40 side. FIGS. 5(A)-(H) show an example of the transferring process according to this embodiment. First, in a substantially same manner as described above in association with the embodiment shown in FIGS. 3(A) and 3(B), an insulating layer 14 and an SiOF layer (interlaminar insulating layer 52) are formed above the base Si substrate. Next, as shown in FIG. 5(A), an electrode layer 20, an dielectric layer 22, and an electrode layer 24 are formed above the interlaminar insulating layer 52 by sputtering or any other suitable method. Those electrode layers 20 and 24 and dielectric layer 24 are processed by, for example, dry etching process to form the MIM capacitor 30 having an MIM structure as shown in FIG. 5(B). Further, as shown in FIG. 5(C), an SiN film as a passivation film 62 is formed on the MIM capacitor 30.

Next, origins of peeling, represented by Arrow P in FIG. 5(D), are mechanically formed by etching the interface between $SiO_2$—SiOF layer (insulating layer 14-interlaminar insulating layer 52) and the electrode layer 20 using an ion beam from above the MIM capacitor 30 formed on the supporting substrate 12. In parallel with this, an adhesive layer 46B made of Si—Fe is formed on the passivation film 62. The adhesive layer 46B may serve as a bonding intermediate layer providing a high adhesiveness with transfer substrate 40. Subsequently, as shown in FIG. 5(E), an adhesive layer 46A made of Si—Fe may be formed by irradiating the surface of the transfer substrate 40 side provided with Si film 42 with an ion beam so that the adhesiveness with MIM capacitor 30 side of the supporting substrate 12 are sufficiently high. Next, as shown in FIG. 5(F), the bonding intermediate layer (adhesive layer 46B) of the supporting substrate 12 side and the adhesive layer 46A of the transfer substrate 40 side are placed in close contact and a load is applied thereto so that the Si film 42 and the adhesive layers 46A and 46B are sufficiently bonded.

In this embodiment, origins of peeling provided on the interface between the interlaminar insulating layer and the electrode layer 20 in the step illustrated in FIG. 5(D) may cause the adhesion force $F_B$ at the interface to be smaller than is the adhesion force $F_A$ at the adhesive layer 46, which allows the MIM capacitor 30 to be peeled off from the base substrate 12 side and then transferred to the transfer substrate 40 side when the base substrate 12 is moved away from the transfer substrate 40. The resulting component is shown in FIG. 5(G) as being vertically inverted. Next, the transfer substrate 40 is processed using appropriate processing and a conductor 66 connected with the electrode layer 24 of the MIM capacitor 30 is filled in a via hole 64 to form the circuit board 60, as shown in FIG. 5(H). The electric connection to the electrode layer 24 may be made in any suitable manner. According to this embodiment, the peeling off and transferring of the MIM capacitor 30 may be facilitated due to the physical origins of peeling formed on the electrodes and the supporting substrate 12.

The present disclosure is not to be limited in terms of the particular embodiments described herein, which are intended as illustrations of various aspects. Many modifications and variations can be made without departing from its spirit and scope, as will be apparent to those skilled in the art. the present invention. For example, the present disclosure may be applied to various known transferring techniques for thin film components having an MIM structure.

What is claimed is:

1. A transfer method for transferring a thin film component having a MIM structure from a supporting substrate to a transfer substrate comprising:
    forming an insulating film on a surface of an MIM film formed on a supporting substrate;
    forming an adhesive layer made of a metal and Si in a super vacuum atmosphere on at least either a first surface of the insulating film or a second surface of the transfer substrate;
    bonding the supporting substrate and the transfer substrate while applying a load such that the first surface of the supporting substrate and the second surface of the transfer substrate are in contact with one another via the adhesive layer; and
    transferring the MIM film from the supporting substrate to the transfer substrate;
    wherein an adhesion force $F_A$ and an adhesion force $F_B$ are controlled to meet the relationship of $F_A > F_B$, where the adhesion force $F_A$ represents an adhesion force of the adhesive layer; and the adhesion force $F_B$ represents an adhesion force at the interface between the supporting substrate and the MIM film.

2. The method of claim 1, further comprising:
    forming an Si film on the transfer substrate; and
    forming a second adhesive layer on the Si film.

3. The method of claim 1, wherein the supporting substrate is heat resistant, wherein the transfer substrate is non-heat resistant, and wherein the MIM film comprises a dielectric film with a high dielectric constant sandwiched by an upper electrode and a lower electrode.

4. The method of claim 1, wherein the MIM film is formed on the supporting substrate via an interlaminar insulating layer, the method further comprising reducing the adhesion force $F_B$ between the supporting substrate and the MIM film from the interlaminar insulating layer to meet the relationship of $F_A > F_B$.

5. The method of claim 4, wherein reducing the adhesion force $F_B$ is carried out after the MIM film is formed on the interlaminar insulating layer.

6. The method of claim 4 further comprising forming mechanical origins of peeling on the interface between the MIM film and the interlaminar insulating layer after the MIM film is formed on the interlaminar insulating layer.

7. The method of claim 1 further comprising forming an MIM capacitor structure by processing the MIM film after the MIM film is formed and before the insulating film is formed.

8. The method of claim 1 further comprising forming an MIM capacitor structure by processing the MIM film before the MIM film is transferred to the transfer substrate.

9. The method of claim 1, wherein the super vacuum atmosphere is on the order of $10^{-6}$-$10^{-7}$ Pa of less.

10. The method of claim 9, wherein the super vacuum atmosphere is on the order of $10^{-6}$-$10^{-7}$ Pa.

11. A circuit board comprising a thin film component which is transferred to a transfer substrate via an adhesive layer by a method comprising:
   forming an insulating film on a surface of an MIM film formed on a supporting substrate;
   forming an adhesive layer made of a metal and Si in a super vacuum atmosphere on at least either a first surface of the insulating film or a second surface of the transfer substrate;
   bonding the supporting substrate and the transfer substrate while applying a load such that the first surface of the supporting substrate and the second surface of the transfer substrate are in contact with one another via the adhesive layer; and
   transferring the MIM film from the supporting substrate to the transfer substrate;
   wherein an adhesion force $F_A$ and an adhesion force $F_B$ are controlled to meet the relationship of $F_A > F_B$, where the adhesion force $F_A$ represents an adhesion force of the adhesive layer; and the adhesion force $F_B$ represents an adhesion force at the interface between the supporting substrate and the MIM film.

12. The circuit board of claim 11, wherein the method further comprises:
   forming an Si film on the transfer substrate; and
   forming a second adhesive layer on the Si film.

13. The circuit board of claim 11, wherein the supporting substrate is heat resistant, wherein the transfer substrate is non-heat resistant, and wherein the MIM film comprises a dielectric film with a high dielectric constant sandwiched by an upper electrode and a lower electrode.

14. The circuit board of claim 11, wherein the MIM film is formed on the supporting substrate via an interlaminar insulating layer, the method further comprising reducing the adhesion force $F_B$ between the supporting substrate and the MIM film from the interlaminar insulating layer to meet the relationship of $F_A > F_B$.

15. The circuit board of claim 14, wherein the method further comprises reducing the adhesion force $F_B$ is carried out after the MIM film is formed on the interlaminar insulating layer.

16. The circuit board of claim 14, wherein the method further comprises forming mechanical origins of peeling on the interface between the MIM film and the interlaminar insulating layer after the MIM film is formed on the interlaminar insulating layer.

17. The circuit board of claim 11 wherein the method further comprises forming an MIM capacitor structure by processing the MIM film after the MIM film is formed and before the insulating film is formed.

18. The circuit board of claim 11 wherein the method further comprises forming an MIM capacitor structure by processing the MIM film before the MIM film is transferred to the transfer substrate.

19. The circuit board of claim 11, wherein in the method the super vacuum atmosphere is on the order of $10^{-6}$-$10^{-7}$ Pa of less.

20. The circuit board of claim 19, wherein in the method the super vacuum atmosphere is on the order of $10^{-6}$-$10^{-7}$ Pa.

* * * * *